US011294291B2

(12) United States Patent
Van De Kerkhof et al.

(10) Patent No.: US 11,294,291 B2
(45) Date of Patent: Apr. 5, 2022

(54) LITHOGRAPHIC APPARATUS

(71) Applicant: ASML Netherlands B.V., Veldhoven (NL)

(72) Inventors: Marcus Adrianus Van De Kerkhof, Helmond (NL); Johannes Hubertus Josephina Moors, Roosteren (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/982,650

(22) PCT Filed: Mar. 11, 2019

(86) PCT No.: PCT/EP2019/055937
§ 371 (c)(1),
(2) Date: Sep. 21, 2020

(87) PCT Pub. No.: WO2019/197091
PCT Pub. Date: Oct. 17, 2019

(65) Prior Publication Data
US 2021/0026258 A1 Jan. 28, 2021

(30) Foreign Application Priority Data

Apr. 12, 2018 (EP) .................................... 18166991
Jul. 19, 2018 (NL) .................................... 2021345

(51) Int. Cl.
*G03F 7/20* (2006.01)
(52) U.S. Cl.
CPC ...... *G03F 7/70916* (2013.01); *G03F 7/70033* (2013.01)

(58) Field of Classification Search
CPC .......... H05G 2/00–008; G03F 7/70033; G03F 7/70191; G03F 7/702; G03F 7/70908; G03F 7/70916; G03F 7/70941
USPC .................................. 355/30, 53, 67, 71, 77
See application file for complete search history.

(56) References Cited

U.S. PATENT DOCUMENTS

| 4,292,055 | A  | 9/1981  | De Castella et al.   |
| 6,359,969 | B1 | 3/2002  | Shmaenok             |
| 6,933,510 | B2 | 8/2005  | Zukavishvili et al.  |
| 7,034,308 | B2 | 4/2006  | Bakker et al.        |
| 7,291,853 | B2 | 11/2007 | Fomenkov et al.      |

(Continued)

FOREIGN PATENT DOCUMENTS

| EP | 3272432 A2    | 1/2018  |
| WO | 2017207512 A2 | 12/2017 |

OTHER PUBLICATIONS

Guillaume Roesch, European Patent Office International Searching Authority, International Search Report and Written Opinion, corresponding PCT Application No. PCT/EP2019/055937, dated Jun. 7, 2019, 13 pages total.

(Continued)

*Primary Examiner* — Colin W Kreutzer
(74) *Attorney, Agent, or Firm* — DiBerardino McGovern IP Group LLC

(57) ABSTRACT

A component of a lithographic apparatus, the component having a contaminant trap surface provided with recesses configured to trap contaminant particles and to reduce specular reflection of DUV radiation. The recesses can have at least one dimension less than or equal to about 2 μm, desirably less than 1 μm.

18 Claims, 5 Drawing Sheets

(56) References Cited

U.S. PATENT DOCUMENTS

| | | | |
|---|---|---|---|
| 8,946,661 B2 | 2/2015 | Loopstra et al. | |
| 2001/0051304 A1* | 12/2001 | Stivers | G21K 1/062 |
| | | | 430/5 |
| 2005/0077483 A1* | 4/2005 | Bakker | G03F 7/70916 |
| | | | 250/492.1 |
| 2005/0225739 A1 | 10/2005 | Hiura | |
| 2005/0275835 A1 | 12/2005 | Sogard | |
| 2007/0231713 A1* | 10/2007 | Bristol | G03F 7/091 |
| | | | 430/5 |
| 2010/0053576 A1* | 3/2010 | Loopstra | G03F 7/70891 |
| | | | 355/30 |
| 2012/0262688 A1 | 10/2012 | De Vries et al. | |
| 2014/0051015 A1* | 2/2014 | Gallagher | G03F 1/24 |
| | | | 430/5 |
| 2016/0172207 A1 | 6/2016 | Kwon et al. | |
| 2016/0249442 A1* | 8/2016 | Kuritsyn | H05G 2/008 |
| 2017/0315438 A1* | 11/2017 | Qi | G03F 1/24 |
| 2019/0094699 A1* | 3/2019 | Schuster | G02B 19/0047 |
| 2019/0137861 A1* | 5/2019 | De Groot | G03F 1/44 |

OTHER PUBLICATIONS

M. Faucon et al., "Surface blackening by laser texturing with high repetition rate femtosecond laser up to 1MHz", Proc. SPIE 8972, Frontiers in Ultrafast Optics: Biomedical, Scientific, and Industrial Applications XIV, 89721M (Mar. 7, 2014); doi: 10.1117/12.2039469.

L.C.J. Heijmans, "Quantifying plasma particle lofting," Technische Universiteit Eindhoven, Feb. 2, 2017, 199 pages.

* cited by examiner

LITHOGRAPHIC APPARATUS

CROSS-REFERENCE TO RELATED APPLICATIONS

This application claims priority of EP application 18166991.2 which was filed on Apr. 12, 2018 and NL application 2021345 which was filed on Jul. 19, 2018 and which are incorporated herein in its entirety by reference.

FIELD

The present invention relates to lithographic apparatus. The present invention has particular, but not exclusive, use in connection with EUV lithographic apparatus and EUV lithographic tools.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g., a mask) onto a layer of radiation-sensitive material (resist) provided on a substrate.

The wavelength of radiation used by a lithographic apparatus to project a pattern onto a substrate determines the minimum size of features that can be formed on that substrate. A lithographic apparatus that uses EUV radiation, that is electromagnetic radiation having a wavelength within the range 4-20 nm, may be used to form smaller features on a substrate than a lithographic apparatus using DUV radiation (for example with a wavelength of 193 nm).

Dust or other contaminants on a patterning device in a lithographic apparatus can be particularly troublesome as a dust particle or other contaminant might be imaged on each device that is made. If the effect on the manufactured pattern prevents the device from functioning properly, the yield will be severely impacted until the patterning device can be cleaned. Measures to minimise contamination in the lithographic apparatus, especially in the vicinity of the patterning device, are very important.

SUMMARY

According to a first aspect of the invention there is provided a component of a lithographic apparatus, the component having a contaminant trap surface texture provided with recesses configured to trap contaminant particles and to reduce specular reflection of DUV radiation (which is a spurious component of EUV generation).

In an embodiment, the recesses have at least one dimension less than or equal to about 2 µm, desirably less than 1 µm.

According to a second aspect of the invention there is provided a method of manufacturing a contaminant trap for a lithographic apparatus, the method comprising: treating a surface of a component of the lithographic apparatus so as to form recesses configured to trap contaminant particles and to reduce specular reflection of DUV radiation.

According to a third aspect of the invention there is provided a use of a component according to the invention in a lithographic apparatus for trapping contaminant particles and reducing specular reflection of DUV radiation. The lithographic apparatus may be an EUV lithographic apparatus.

According to a fourth aspect of the invention there is provided a use of a surface texture in a lithographic apparatus for trapping contaminant particles and reducing specular reflection of DUV radiation, the surface texture having a plurality of recesses, the recesses having a width of less than or equal to about 2 µm and a depth greater than or equal to about 1 µm. The lithographic apparatus may be an EUV lithographic apparatus. The width of the recesses may be less than 1 µm. The depth of the recesses may be greater than or equal to 10 µm.

The first, second, third and fourth aspect of the invention enable trapping of particles having a size not much smaller than the width of the grooves. The particles to be trapped may have a size smaller than up to about 1 µm.

Features of different aspects of the invention may be combined with features of other aspects of the invention.

BRIEF DESCRIPTION OF THE DRAWINGS

Embodiments of the invention will now be described, by way of example only, with reference to the accompanying schematic drawings, in which.

DETAILED DESCRIPTION

Figure 1:
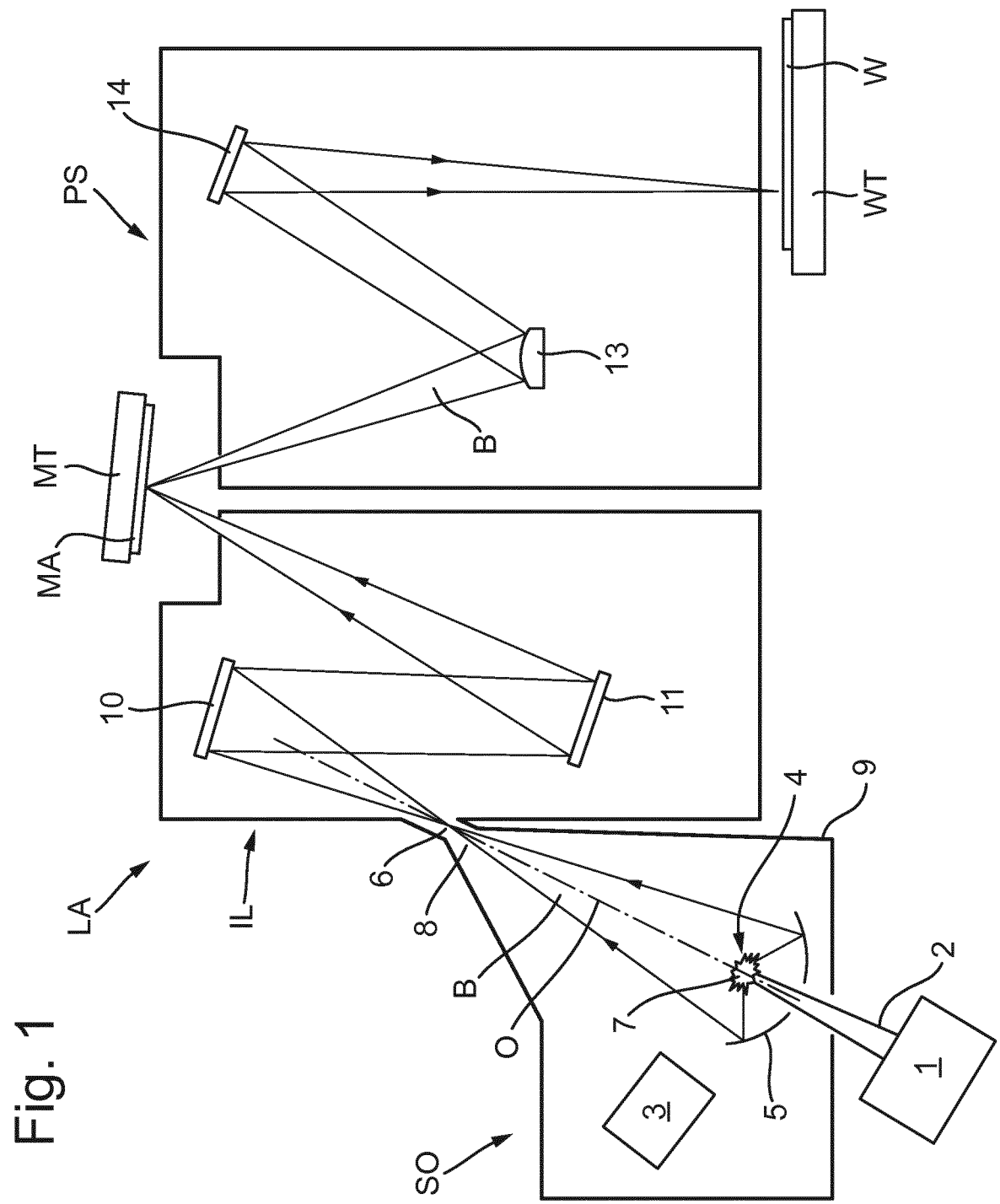
FIG. 1 is a schematic illustration of a lithographic system comprising a lithographic apparatus and a radiation source.

FIG. 1 is a schematic illustration of a lithographic system. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA, a projection system PS and a substrate table WT configured to support a substrate W. The illumination system IL is configured to condition the radiation beam B before it is incident upon the patterning device MA. The projection system is configured to project the radiation beam B (now patterned by the patterning device MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in the illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type that may be referred to as a laser produced plasma (LPP) source. A laser 1, which may for example be a $CO_2$ laser, is arranged to deposit energy via a laser beam 2 into a fuel, such as tin (Sn) that is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, for example, in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure that is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

In other embodiments of a laser produced plasma (LPP) source the collector 5 may be a so-called grazing incidence collector that is configured to receive EUV radiation at grazing incidence angles and focus the EUV radiation at an intermediate focus. A grazing incidence collector may, for example, be a nested collector, comprising a plurality of grazing incidence reflectors. The grazing incidence reflectors may be disposed axially symmetrically around an optical axis O.

The radiation source SO may include one or more contamination traps (not shown). For example, a contamination trap may be located between the plasma formation region 4 and the radiation collector 5. The contamination trap may for example be a rotating foil trap, or may be any other suitable form of contamination trap.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA (which may for example be a mask) reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors 13, 14 that are configured to project the radiation beam B onto a substrate W held by the substrate table WT. The mirrors 13, 14 which form the projection system may be configured as reflective lens elements. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of mirrors (e.g. six mirrors).

The lithographic apparatus may, for example, be used in a scan mode, wherein the support structure (e.g. mask table) MT and the substrate table WT are scanned synchronously while a pattern imparted to the radiation beam is projected onto a substrate W (i.e. a dynamic exposure). The velocity and direction of the substrate table WT relative to the support structure (e.g. mask table) MT may be determined by the demagnification and image reversal characteristics of the projection system PS. The patterned radiation beam that is incident upon the substrate W may comprise a band of radiation. The band of radiation may be referred to as an exposure slit. During a scanning exposure, the movement of the substrate table WT and the support structure MT may be such that the exposure slit travels over an exposure field of the substrate W.

The radiation source SO and/or the lithographic apparatus that is shown in FIG. 1 may include components that are not illustrated. For example, a spectral filter may be provided in the radiation source SO. The spectral filter may be substantially transmissive for EUV radiation but substantially blocking for other wavelengths of radiation such as infrared radiation.

In other embodiments of a lithographic system the radiation source SO may take other forms. For example, in alternative embodiments the radiation source SO may comprise one or more free electron lasers. The one or more free electron lasers may be configured to emit EUV radiation that may be provided to one or more lithographic apparatuses.

A masking system according to an embodiment of the invention is now described with reference to FIGS. 2 to 5. The masking system is located in the illumination system and controls the area of an object (for example a patterning device MA) that is illuminated by the radiation beam.

In use, the masking system is disposed such that it can be moved into and out of the optical path of radiation between the illumination system IL and the projection system PS. Such a masking apparatus provides control over the distribution of radiation in field planes of the lithographic apparatus that are downstream of the apparatus. Such field planes include the plane of the support structure MT (i.e. the plane of a patterning device MA) and the plane of the substrate table WT (i.e. the plane of a substrate W).

Figure 2:
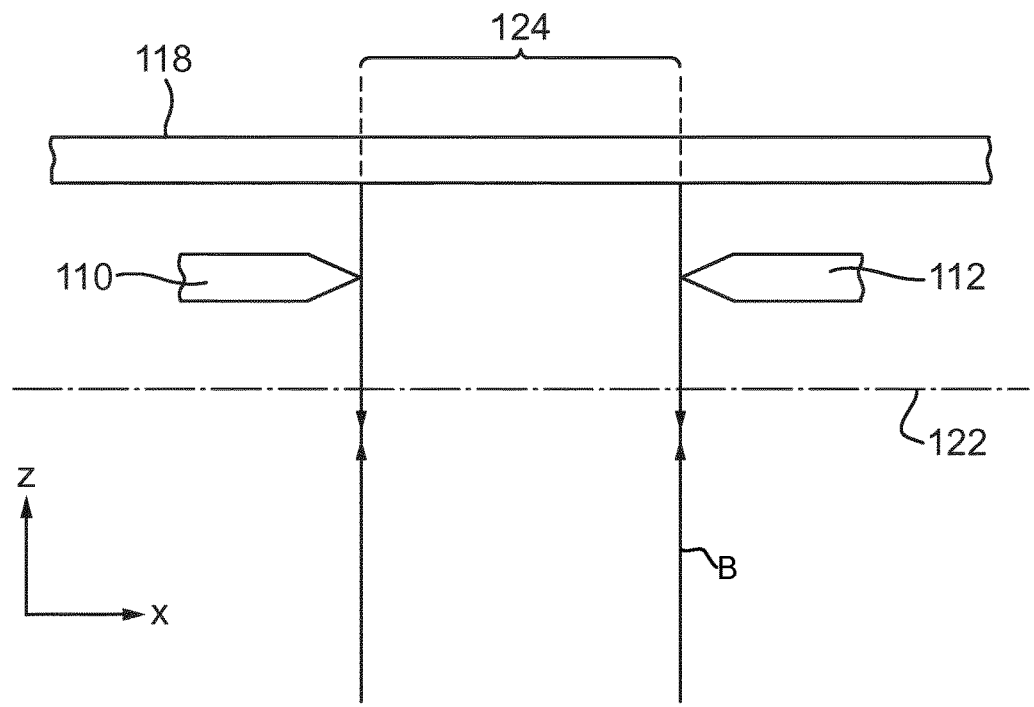
FIG. 2 is a schematic illustration of a first cross-section through an object on the support structure and masking blades of the lithographic apparatus of FIG. 1.
Figure 3:
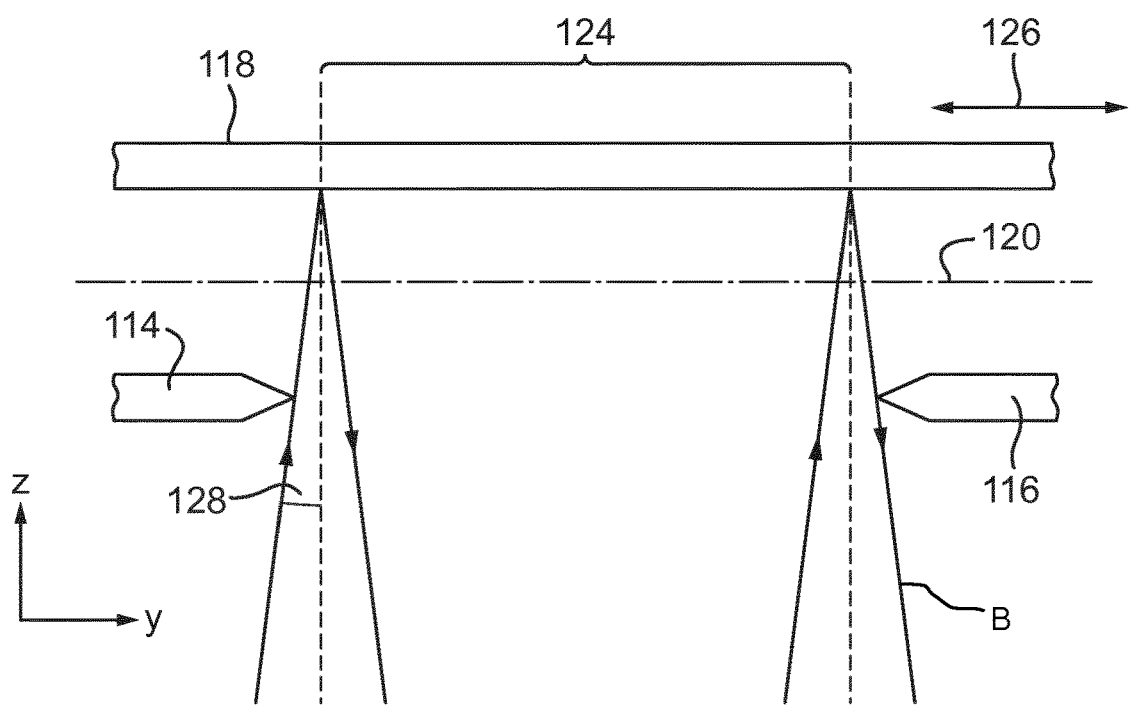
FIG. 3 is a schematic illustration of a second cross-section through an object on the support structure and masking blades of the lithographic apparatus of FIG. 1.

The lithographic apparatus is provided with four masking blades, which define the extent of the field on the patterning device MA which is illuminated, as now described with reference to FIGS. 2 and 3. These blades are sometimes referred to as reticle masking blades. The illumination system IL is operable to illuminate a generally rectangular region of an object disposed on the support structure MT (for example a patterning device MA). This generally rectangular region may be referred to as the slit of the illumination system IL and is defined by four masking blades. The extent of the generally rectangular region in a first direction, which may be referred to as the x direction, is defined by a pair of x-masking blades 110, 112. The extent of the generally rectangular region in a second direction, which may be referred to as the y direction, is defined by a pair of y-masking blades 114, 116.

Each of the masking blades 110, 112, 114, 116 is disposed close to, but slightly out of, the plane of an object 118 on the support structure MT. The x-masking blades 110, 112 are disposed in a first plane 120 and the y-masking blades 114, 116 are disposed in a second plane 122.

Each of the masking blades 110, 112, 114, 116 defines one edge of a rectangular field region 124 in the plane of the object 118 which receives radiation. Each blade may be independently movable between a retracted position wherein it is not disposed in the path of the radiation beam and an inserted position wherein it at least partially blocks the radiation beam projected onto the object 118. By moving the masking blades 110, 112, 114, 116 into the path of the radiation beam, the radiation beam B can be truncated (in the x and/or y direction) thus limiting the extent of the field region 124 which receives radiation beam B.

The x direction may correspond to a non-scanning direction of the lithographic apparatus LA and the y direction may correspond to a scanning direction of the lithographic apparatus LA. That is, the object 118 may be movable in the y-direction through the field region 124 (as indicated by arrow 126) so as to expose a greater region of the object in a single dynamic scanning exposure.

During a dynamic exposure of a target region of a substrate W the target region is moved through an exposure region in the plane of the substrate W, the exposure region being a portion of the substrate W that the exposure region 124 of the object 118 is projected onto by projection system PS. As the target region of the substrate W moves into the exposure region, the first masking blade 114, 116 moves such that only the target region receives radiation (i.e. no parts of the substrate outside of the target region are exposed). At the start of the scanning exposure one of the y-masking blades 114, 116 is disposed in the path of the radiation beam B, acting as a shutter, such that no part of the substrate W receives radiation. At the end of the scanning exposure, the other of the y-masking blades 114, 116 is disposed in the path of the radiation beam B, acting as a shutter, such that no part of the substrate W receives radiation.

Rays of radiation beam B are shown adjacent to each of the masking blades 110, 112, 114, 116. It will be appreciated that each point in the field region 124 is illuminated with radiation from a range of angles. For example, each point in the field region 124 may receive a cone of radiation. The rays of radiation beam B are shown adjacent to each of the masking blades 110, 112, 114, 116 indicate an average direction of the radiation received by the object. As can be seen from FIGS. 2 and 3, in this embodiment, as projected onto the x-z plane, radiation is generally normally incident on the object 118 whereas as projected onto the y-z plane, radiation is generally incident on the object 118 at an angle 128.

Figure 4:
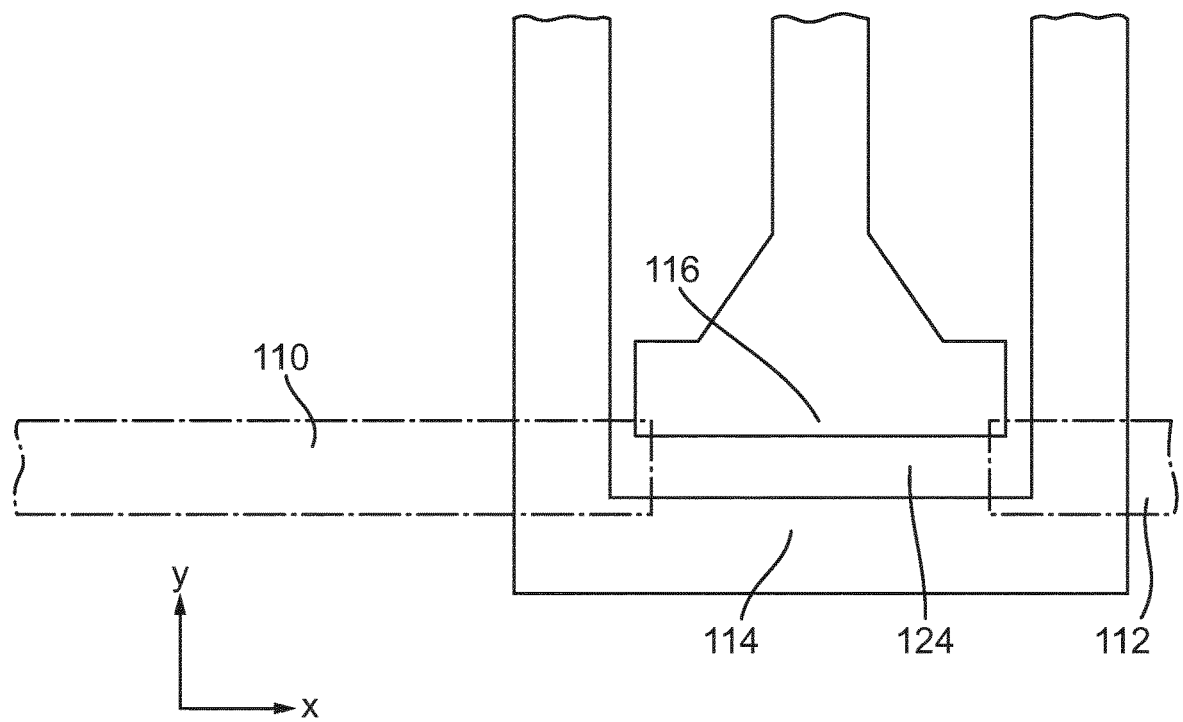
FIG. 4 is a plan view showing the y-masking blades and the x-masking blades (dotted lines) of the lithographic apparatus of FIG. 1 in a first configuration.
Figure 5:
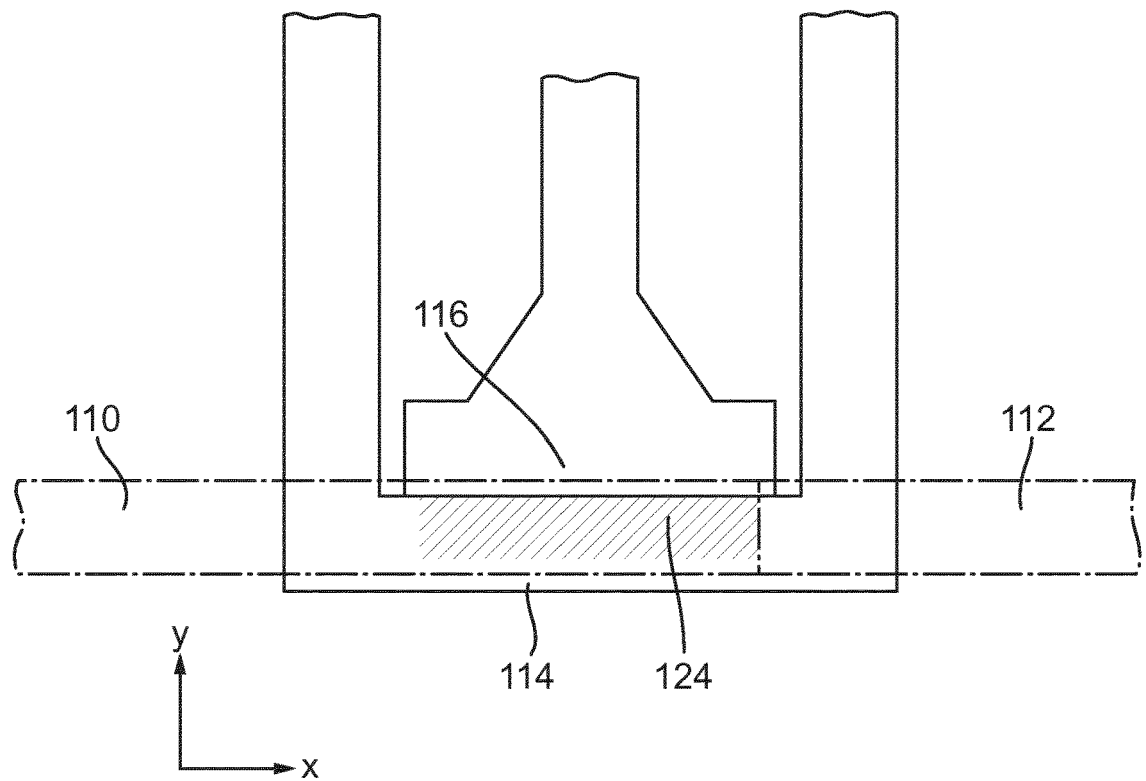
FIG. 5 is a plan view showing the y-masking blades and the x-masking blades (dotted lines) of the lithographic apparatus of FIG. 1 in a second configuration.

FIGS. 4 and 5 show a plan view of the y-masking blades 114, 116 with the position of the x-masking blades 110, 112 shown in dotted lines. In FIG. 4, the four masking blades 110, 112, 114, 116 are disposed so as to define a generally rectangular field region 124. This may be a typical configuration of the four masking blades 110, 112, 114, 116 during the exposure of a central portion of a target region (for example a die on a substrate W). As explained above, each of the x-masking blades 110, 112 is operable to move in the x direction and each of the y-masking blades 114, 116 is operable to move in the y direction to control the size of the field region 124. The y-masking blades 114, 116 are configured such that they can be actuated from the same side of the field region 124. To achieve this, the y-masking blades 114, 116 are shaped such that (although they lie in substantially the same plane 122) each of the y-masking blades 114, 116 is provided with one or more support portions which extend in the same direction (the positive y direction in FIGS. 4 to 5).

In FIG. 5, relative to the configuration shown in FIG. 4, one of the y-masking blades 114 has moved (in the positive y direction) such that it is disposed in the path of the radiation beam B, acting as a shutter. Furthermore, one of the x masking blades 110 has moved (in the positive x direction) such that it is also disposed in the path of the radiation beam B, acting as a shutter. Also shown in FIG. 5 (as a cross-hatched rectangle) is the field region 124 corresponding to the configuration of masking blades shown in FIG. 4. FIGS. 4 and 5 may be considered to represent two end positions of nominal movement of y-masking blade 114 and x-masking blade 110, with FIG. 4 representing a retracted position allowing exposure of a substrate W and FIG. 5 representing an inserted position acting as a shutter to prevent exposure of a substrate W.

As mentioned above, it is highly desirable in a lithographic apparatus to prevent contaminants, such as particles, adhering to sensitive components of the lithographic apparatus. In particular, particles on a patterning device such as a mask are undesirable because they might be imaged onto every target portion of every substrate that is imaged using the patterning device. If the particle is of a size and/or position on the patterning device that its image when printed causes a device to malfunction, yield of the lithographic process will be very severely affected. Even when a pellicle is used to prevent particles settling directly on the patterning device, large and/or numerous particles can cause imaging errors and/or a loss of contrast at substrate level.

The masking blades described above can be a source of particles that may end up on the patterning device. The masking blades are moving parts so that there is a risk of particles being created through friction. In addition, there is a risk that when the reticle-masking blades are moved across the patterning device, particles can be transported from elsewhere in the apparatus and end up on the patterning device. Furthermore, cooling gas flows in the vicinity of the masking blades and patterning device can transfer particles to the patterning device.

It is also desirable in an EUV lithographic apparatus to suppress the transmission of DUV radiation, which is an undesired component of the radiation generated by the plasma, to the substrate. Such DUV radiation may have wavelengths in the range of 100 nm to 300 nm. Any DUV radiation that reaches the substrate will reduce contrast of the projected image, since the resist is sensitive to such DUV radiation as well as EUV radiation, and hence DUV radiation reduces the process window.

Accordingly, the present invention provides a component which acts as a contaminant trap by having a surface treatment that generates a texture including recesses on the treated surface that both enhances attachment of particles and reduces reflectance of DUV radiation.

In an embodiment of the invention, the recesses have at least one dimension less than or equal to about 2 µm, desirably less than 1 µm. The recesses are desirably closely packed and evenly distributed across the relevant surface. The exact shape and form of the recesses is less important than their dimensions. Desirably the recesses are deeper than the size of particles to be trapped but have widths not much greater than the particles to be trapped. In this way, particles can be held in the recesses by electrostatic forces, such as van der Waals forces. Particles which are held within the recesses are then less likely to transfer to the patterning device. In addition, particles that are held in the recesses cannot migrate across the surface of the component and so are less likely to aggregate and coalesce. Aggregated particles are more likely to be dislodged from a moving component such as a masking blade and more likely to cause imaging errors.

In an embodiment of the invention the recesses have a depth greater than or equal to about 1 µm, desirably greater than or equal to about 10 µm. The particle capturing function of the recesses improves with increased depth and so a deeper recess can be wider whilst still having the same trapping effect. The depth of the recess can be less than or equal to about 500 µm. Recesses may taper in width away from the surface. Recesses may have a width greater than or equal to about 50 nm.

At the same time, the texture provided to the surface of the component reduces the reflectance thereof to DUV radiation. The reflectance to DUV is reduced compared to the case where no treatment is performed to the respective surface. In an embodiment of the invention, the reflectance to DUV is reduced to below 20%. In this context, DUV radiation should be considered radiation having a wavelength in the range of from 100 nm to 300 nm. In an embodiment, the specular reflectance is reduced to less than 20%, the balance of the incident radiation may be scattered or absorbed. It is sufficient to reduce the specularly reflected radiation only since most scattered radiation is absorbed elsewhere in the apparatus and doesn't reach the substrate being exposed. It is only at the substrate that DUV radiation causes a problem.

Figure 8:
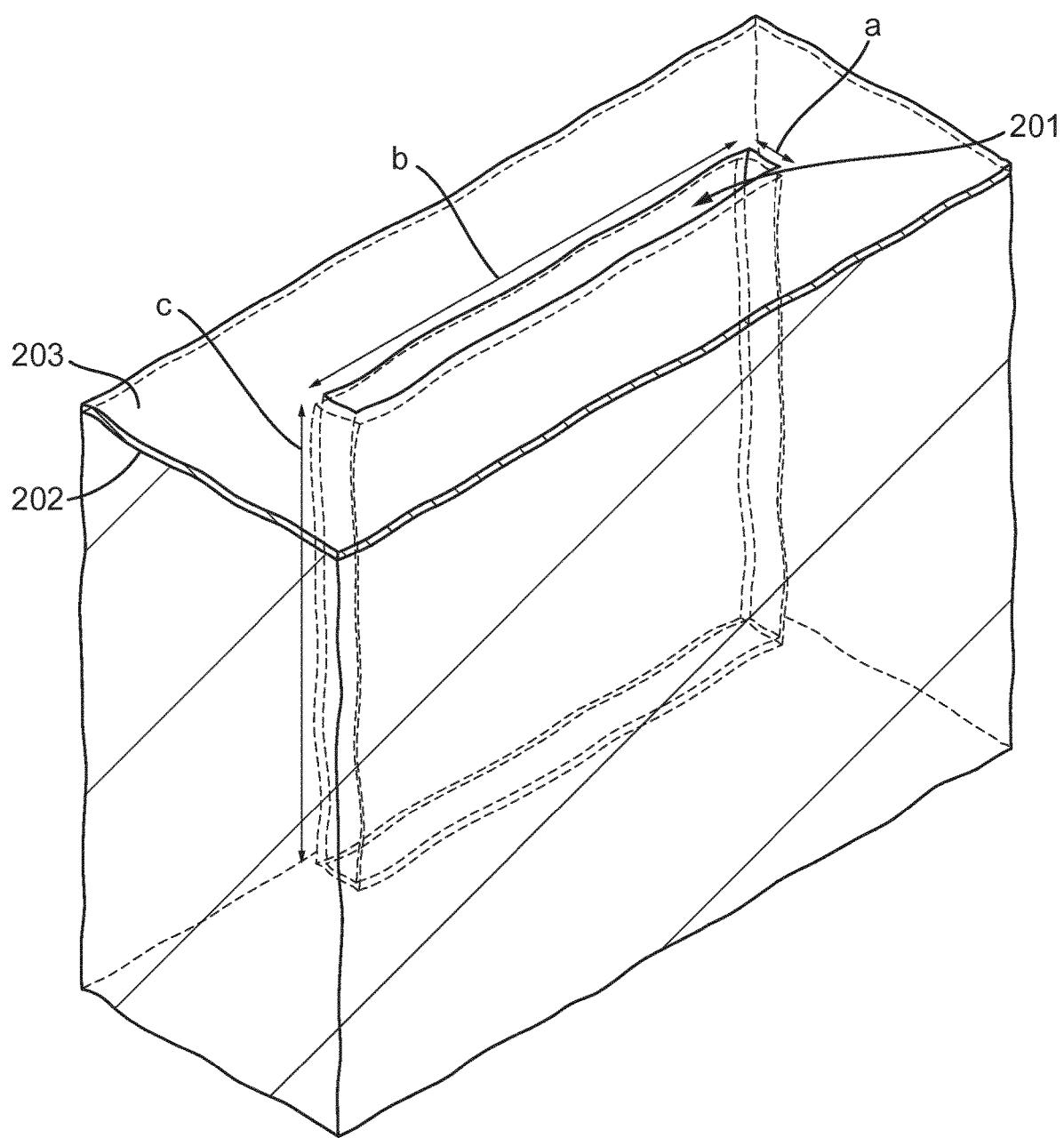
FIG. 8 depicts a trough in a surface texture of an embodiment of the invention.

In an embodiment of the present invention, the recesses are elongate, e.g. in a form of troughs 201, as shown in FIG. 8. Such recesses are convenient to manufacture. The orientation of the troughs does not matter. The lengths b of the troughs does not affect the functioning of the contaminant trap as long as the average width a of the troughs is less than or equal to about 2 µm, desirably less than or equal to about 1 µm.

The surface texture of the present invention forms a contaminant trap which can be provided on various components of the lithographic apparatus. Most advantageously, the contaminant trap of the present invention is provided on surfaces that are close to the patterning device, such as surfaces of: masking blades; safety clamps for the patterning device; safety bumpers for the patterning device; and heat shields for encoders or sensors, such as encoders used to determine displacements of the patterning device.

The contaminant trap of the present invention can also advantageously be applied in parts of the lithographic apparatus where contaminant levels and/or DUV levels are particularly high. An example of such a location is the interior of the source module SO. A further advantage of the present invention in such a location is that larger droplets of molten tin do not adhere well to the textured surface due to the high surface tension. Droplets of tin that impact the surface will therefore likely flow or fall off, maintaining the desirable properties of the textured surface for long time periods.

Figure 6:
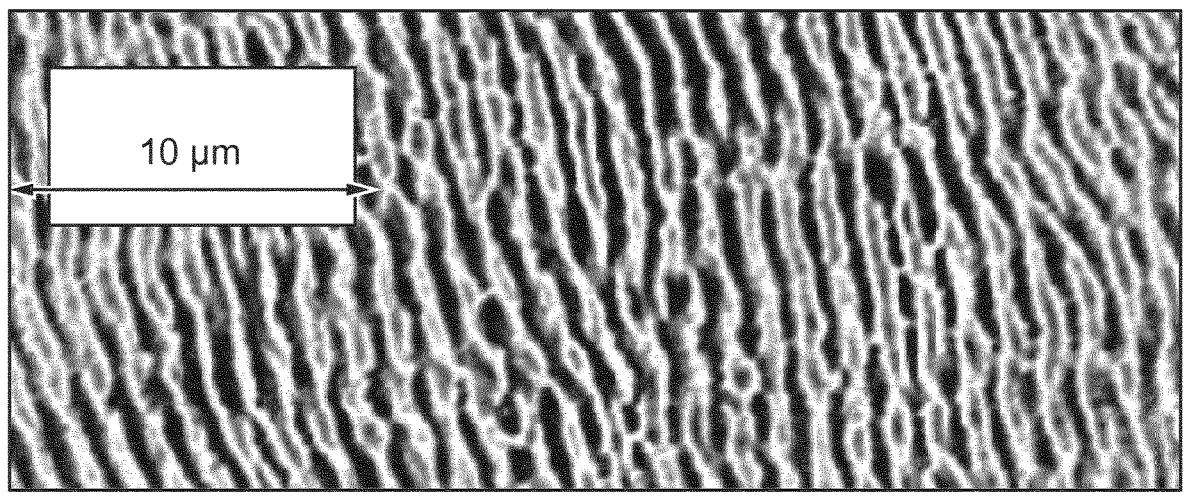
FIG. 6 is an image of a surface texture usable in embodiments of the invention.

Various techniques can be employed to generate the desired surface texture. For example, the surface texture can be formed by interference lithography, imprint lithography, femtosecond laser texturing or selective etching. A femtosecond laser surface texturing technique is described in "Surface blackening by laser texturing with high repetition rate femtosecond laser up to 1 MHz" by M Faucon et al (Proc. SPIE 8972, Frontiers in Ultrafast Optics: Biomedical, Scientific, and Industrial Applications XIV, 89721M (7 Mar. 2014)), which document is incorporated herein by reference. This technique can generate a surface texture as illustrated in FIG. 6.

Figure 7:
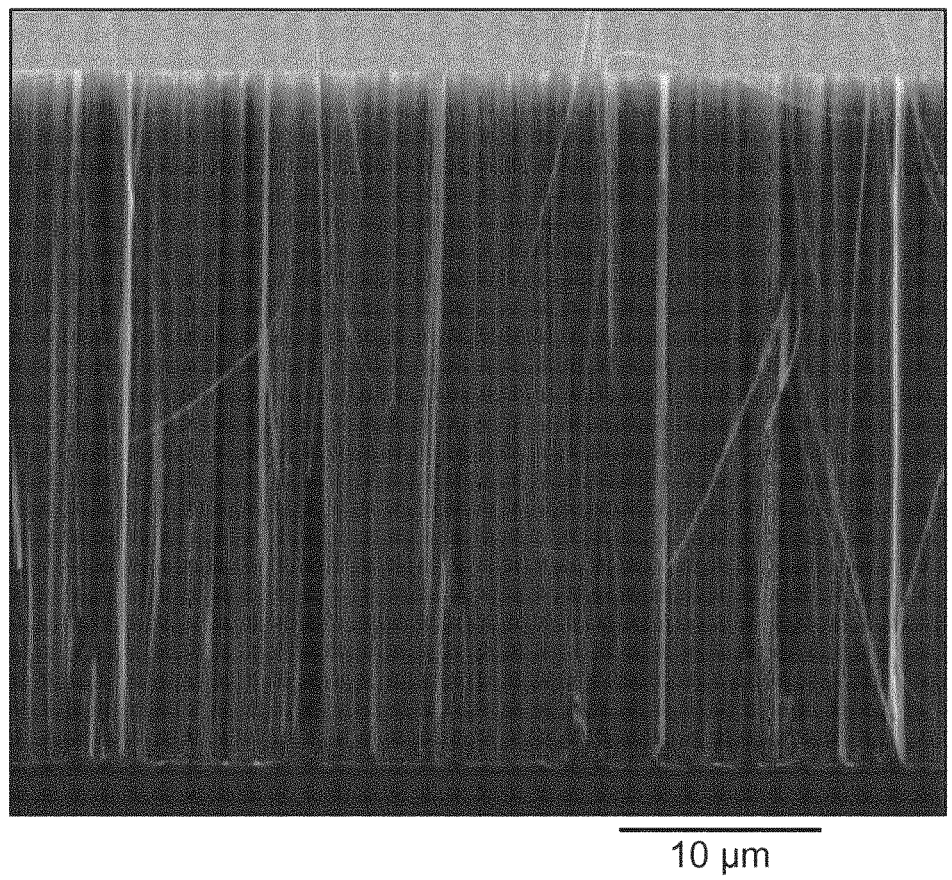
FIG. 7 is an image of another surface texture usable in embodiments of the invention.

FIG. 7 depicts in cross-section a structure achievable using selective etching with gold particles acting as an etch mask as described in J. Duran et al "Fabrication of Ultrahigh Aspect Ratio Silicon Nanostructures using Self-Assembled Gold Metal-Assisted Chemical Etching" (Journal of Micro/Nanolithography MEMS, and MOEMS 16(1):014502 (February 2017)), which document is hereby incorporated in its entirety by reference. In an embodiment of the present invention, it is not necessary to create a texture with an aspect ratio as extreme as depicted in FIG. 7. In an embodiment of the present invention, the aspect ratio (defined as average depth c to average width a) of the recesses of the surface texture is desirably greater than 10. A higher aspect ratio is desirable but not essential.

In an embodiment of the invention, the surface texture can be formed by a process that results in significant variation in the shapes and/or sizes of the recesses. It is not required that all recesses in the surface meet the dimensions and aspect ratios mentioned above. The effectiveness of a contaminant trap according to an embodiment improves if a higher proportion of the recesses meet the specified ranges.

In an embodiment of the invention, the surface 202 of the component is conductive, either the base material is conductive or because a conductive layer is formed on the component, and an insulating layer 203 may be formed on the surface. The component, or the conductive layer, is grounded. Such an arrangement improves trapping of particles. Often particles in a lithographic apparatus are charged, e.g. due to the EUV radiation. A charged particle will be attracted to the component by Coulomb forces. On the other hand, if the surface of the component becomes charged, the resulting electric field can have the effect of repelling like-charged and neutral particles. This can be prevented by grounding the surface 202 of the component.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A contaminant trap of a lithographic apparatus, the contaminant trap having a contaminant trap surface texture provided with recesses configured to trap contaminant particles and to reduce specular reflection of DUV radiation, wherein:
the texture comprises a plurality of recesses having a maximum depth greater than about 1 μm; and/or
the texture comprises a plurality of recesses having an aspect ratio, defined as the ratio of the average depth of the recess to the average width of the recess in the plane of the surface, greater than or equal to about 10.

2. The contaminant trap according to claim 1, wherein the recesses have at least one dimension less than or equal to about 2 μm.

3. The contaminant trap according to claim 2, wherein the recesses are elongate and the at least one dimension is the width of the recesses in the plane of the trap surface.

4. The contaminant trap according to claim 1, wherein the contaminant trap surface texture has a reflectance of less than about 20% for radiation having wavelengths in the range of 100 nm to 300 nm.

5. The contaminant trap according to claim 1, wherein the contaminant trap surface texture comprises a conductive base layer and an insulating layer provided on the base layer.

6. A contaminant trap of a lithographic apparatus, the contaminant trap having a contaminant trap surface texture provided with recesses configured to trap contaminant particles and to reduce specular reflection of DUV radiation, wherein the contaminant trap surface texture comprises a conductive base layer and an insulating layer provided on the base layer, wherein the conductive base layer is connected to an electrical ground.

7. A lithographic apparatus comprising:
the contaminant trap according to claim 1;
an illumination system configured to illuminate a patterning device with EUV radiation; and
a projection system configured to project radiation patterned by the patterning device onto a substrate.

8. A contaminant trap of a lithographic apparatus, the contaminant trap having a contaminant trap surface texture provided with recesses configured to trap contaminant particles and to reduce specular reflection of DUV radiation, wherein the contaminant trap is a component of the lithographic apparatus selected from the group consisting of:
masking blades, safety clamps, safety bumpers and heat shields.

9. A lithographic apparatus comprising:
a contaminant trap of a lithographic apparatus, the contaminant trap having a contaminant trap surface texture provided with recesses configured to trap contaminant particles and to reduce specular reflection of DUV radiation;
an illumination system configured to illuminate a patterning device with EUV radiation;
a projection system configured to project radiation patterned by the patterning device onto a substrate; and
a source module for emitting EUV radiation and wherein the contaminant trap is on a surface close to a patterning device, at an interior of the source module, and/or a part of the wall of the source module.

10. A method of manufacturing a contaminant trap for a lithographic apparatus, the method comprising:
treating a surface of a component of the lithographic apparatus so as to form recesses configured to trap contaminant particles and to reduce specular reflection of DUV radiation, wherein the recesses have a maximum depth greater than about 1 μm.

11. The method according to claim 10, wherein the treating comprises a process selected form the group consisting of interference lithography, imprint lithography, femtosecond laser texturing and selective etching.

12. A method comprising:
arranging a contaminant trap on a surface close to a patterning device and/or at an interior of a source module within a lithographic apparatus, the contaminant trap including a surface texture configured to trap contaminant particles and to reduce specular reflection of DUV radiation.

13. The method according to claim 12, wherein the surface texture includes a plurality of recesses having:
a width of less than or equal to about 2 μm, and
a depth greater than or equal to about 1 μm.

14. The method according to claim 12, wherein arranging the contaminant trap within the lithographic apparatus comprises arranging the contaminant trap on at least one of masking blades, safety clamps, safety bumpers and heat shields.

15. The method according to claim 12, further comprising forming the surface texture by forming recesses on a surface within the lithographic apparatus, the recesses configured to trap the contaminant particles and reduce specular reflection of DUV radiation.

16. The method according to claim 12, wherein the surface texture being configured to trap contaminant particles comprises holding contaminant particles in recesses of the surface texture by electrostatic force.

17. The contaminant trap according to claim 1, wherein the recesses have at least one dimension less than or equal to about 1 μm.

18. The contaminant trap according to claim 1, wherein the texture comprises a plurality of recesses having a maximum depth greater than about 10 μm.

* * * * *